(12) United States Patent
Chen et al.

(10) Patent No.: US 7,993,998 B2
(45) Date of Patent: Aug. 9, 2011

(54) CMOS DEVICES HAVING DUAL HIGH-MOBILITY CHANNELS

(75) Inventors: Ding-Yuan Chen, Taichung (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 680 days.

(21) Appl. No.: 12/043,588

(22) Filed: Mar. 6, 2008

(65) Prior Publication Data
US 2009/0227078 A1 Sep. 10, 2009

(51) Int. Cl.
*H01L 21/8238* (2006.01)

(52) U.S. Cl. ........ 438/199; 438/216; 438/222; 438/230; 257/E21.632

(58) Field of Classification Search .......... 438/199, 438/216, 218, 221, 222, 226, 230; 257/E21.632
See application file for complete search history.

(56) References Cited

U.S. PATENT DOCUMENTS

| | | | |
|---|---|---|---|
| 7,662,689 B2 | 2/2010 | Boyanov et al. | |
| 7,888,197 B2* | 2/2011 | Chidambarrao et al. | 438/221 |
| 2005/0104131 A1* | 5/2005 | Chidambarrao et al. | 257/369 |
| 2005/0136584 A1 | 6/2005 | Boyanov et al. | |
| 2009/0227078 A1* | 9/2009 | Chen et al. | 438/199 |
| 2010/0044754 A1 | 2/2010 | Boyanov et al. | |

FOREIGN PATENT DOCUMENTS
CN 1894774 A 1/2007

OTHER PUBLICATIONS

Curreem, K. K. S., et al., "Comparison of Interfacial and Electrical Characteristics of HfO and HfAlO High-k Dieletrics on Compressively Strained $Si_{1-x}Ge_x$," Applied Physics Letters, 2006, vol. 88, pp. 182905-1-182905-3, American Institute of Physics.

Harris, H. Rusty, et al., "Band-Engineering Low PMOS $V_T$ with High-K/Metal Gates Featured in a Dual Channel CMOS Integration Scheme," Symposium on VLSI Technology Digest of Technical Papers, 2007, pp. 154-155, IEEE.

Huang, J., et al., "A Study of Compressively Strained $Si_{0.5}Ge_{0.5}$ Metal-Oxide-Semiconductor Capacitors with Chemical Vapor Deposition HfAlO as Gate Dielectric," Applied Physics Letters, 2007, vol. 90, pp. 023502-1-023502-3, American Institute of Physics.

(Continued)

*Primary Examiner* — Jack Chen
(74) *Attorney, Agent, or Firm* — Slater & Matsil, L.L.P.

(57) ABSTRACT

A method for forming a semiconductor structure includes providing a semiconductor substrate including a first region and a second region; and forming a first and a second metal-oxide-semiconductor (MOS) device. The step of forming the first MOS device includes forming a first silicon germanium layer over the first region of the semiconductor substrate; forming a silicon layer over the first silicon germanium layer; forming a first gate dielectric layer over the silicon layer; and patterning the first gate dielectric layer to form a first gate dielectric. The step of forming the second MOS device includes forming a second silicon germanium layer over the second region of the semiconductor substrate; forming a second gate dielectric layer over the second silicon germanium layer with no substantially pure silicon layer therebetween; and patterning the second gate dielectric layer to form a second gate dielectric.

11 Claims, 8 Drawing Sheets

OTHER PUBLICATIONS

Leitz, C. W., et al., "Hole Mobility Enhancements in Strained Si/Si$_{1-y}$Ge$_y$ P-type Metal-Oxide-Semiconductor Field-Effect Transistors Grown on Relaxed Si$_{1-x}$Ge$_x$ (x<y) Virtual Substrates," Applied Physics Letters, Dec. 17, 2001, Vo. 79, No. 25, pp. 4246-4248, American Institute of Physics.

* cited by examiner

CMOS DEVICES HAVING DUAL HIGH-MOBILITY CHANNELS

TECHNICAL FIELD

This invention relates generally to semiconductor devices, and more particularly to structures and formation methods of complementary metal-oxide-semiconductor devices.

BACKGROUND

Metal-oxide-semiconductor (MOS) devices are basic building elements in integrated circuits. Many methods have been explored to improve the performance, such as reducing threshold voltages, of MOS devices.

FIGS. 1 through 5 illustrate cross-sectional views of intermediate stages in the manufacturing of a conventional complementary MOS (CMOS) structure. FIG. 1 illustrates silicon substrate 2, including NMOS region 4 and PMOS region 6. High-k gate dielectric layer 8 is blanket formed on silicon substrate 2, followed by the formation of n-metal layer 10. Hard mask 12 is then formed and patterned to mask the NMOS region 4. In FIG. 2, dielectric layer 8 and n-metal layer 10 are removed from PMOS region 6. Silicon substrate 2 is also recessed in PMOS region 6, forming recess 7. Silicon germanium layer 14 is then epitaxially grown in recess 7, as shown in FIG. 3. Next, as illustrated in FIG. 4, high-k gate dielectric layer 16, p-metal layer 18, and hard mask 19 are blanket formed. In FIG. 5, high-k gate dielectric layer 16, p-metal layer 18, and hard mask 19 are removed from NMOS region 4.

The stacked layers shown in FIG. 5 may be used to form gate stacks for an NMOS device (not shown) in NMOS region 4 and a PMOS device (not shown) in PMOS region 6. The channel region of the resulting PMOS device is thus formed of silicon germanium layer 14. Advantageously, the threshold voltage of the PMOS device is reduced. In addition, compared with a PMOS device having a silicon channel, the hole mobility of the PMOS device with the silicon germanium channel is greater. The drive current of the PMOS device formed in PMOS region 6 is thus improved.

The CMOS devices formed using the above-discussed method, however, suffer from drawbacks. The channel region of the NMOS device formed in NMOS region 4 has no strain coming from the underlying substrate, and thus the drive current of the NMOS device is less than optimal. Further, the germanium in silicon germanium layer 14 may diffuse into high-k dielectric layer 16, causing a leakage current in the resulting PMOS device. New formation methods are thus needed to improve the drive currents of NMOS devices and to reduce the leakage currents of PMOS devices.

SUMMARY OF THE INVENTION

In accordance with one aspect of the present invention, a method for forming a semiconductor structure includes providing a semiconductor substrate including a first region and a second region; and forming a first and a second metal-oxide-semiconductor (MOS) device. The step of forming the first MOS device includes forming a first silicon germanium layer over the first region of the semiconductor substrate; forming a silicon layer over the first silicon germanium layer; forming a first gate dielectric layer over the silicon layer; and patterning the first gate dielectric layer to form a first gate dielectric. The step of forming the second MOS device includes forming a second silicon germanium layer over the second region of the semiconductor substrate; forming a second gate dielectric layer over the second silicon germanium layer with no substantially pure silicon layer therebetween; and patterning the second gate dielectric layer to form a second gate dielectric.

In accordance with another aspect of the present invention, a method for forming a semiconductor structure includes providing a silicon substrate including an NMOS region and a PMOS region; epitaxially growing a first silicon germanium layer over the silicon substrate, wherein the first silicon germanium layer includes a first portion over the NMOS region, and a second portion over the PMOS region; epitaxially growing a silicon layer over the first silicon germanium layer; forming a first gate dielectric layer over the silicon layer; forming a first gate electrode layer over the first gate dielectric layer; removing the first gate electrode layer, the first gate dielectric layer, and the silicon layer from over the PMOS region; forming a second gate dielectric layer, wherein the second gate dielectric layer includes at least a portion over the second portion of the first silicon germanium layer; forming a second gate electrode layer over the second gate dielectric layer; patterning the first gate dielectric layer and the first gate electrode layer to form a first gate stack; and patterning the second gate dielectric layer and the second gate electrode layer to form a second gate stack.

In accordance with yet another aspect of the present invention, a method for forming a semiconductor structure includes providing a silicon substrate; epitaxially growing a first silicon germanium layer over the silicon substrate; epitaxially growing a silicon layer over the first silicon germanium layer; removing the silicon layer; epitaxially growing a second silicon germanium layer over the first silicon germanium layer; forming a gate dielectric layer over the silicon layer; and patterning the gate dielectric layer to form a gate dielectric.

In accordance with yet another aspect of the present invention, a semiconductor structure includes a semiconductor substrate including a first region and a second region; and a first and a second MOS device. The first MOS device includes a first silicon germanium layer over the first region of the semiconductor substrate; a silicon layer over the first silicon germanium layer; and a first gate dielectric over the silicon layer. The second MOS device includes a second silicon germanium layer over the second region of the semiconductor substrate; and a second gate dielectric over the second silicon germanium layer. The second MOS device is free from a substantially pure silicon layer between the second silicon germanium layer and the second gate dielectric.

In accordance with yet another aspect of the present invention, a semiconductor structure includes a silicon substrate including a first region and a second region, an NMOS device, and a PMOS device. The NMOS device includes a first silicon germanium layer over the first region of the silicon substrate; a silicon layer over the first silicon germanium layer, wherein the silicon layer is formed of substantially pure silicon; and a first gate dielectric over the silicon layer. The PMOS device includes a second silicon germanium layer over the second region of the silicon substrate, wherein the first and the second silicon germanium layer have a same germanium atomic percentage; a third silicon germanium layer over the second silicon germanium layer; and a second gate dielectric over the third silicon germanium layer.

The advantageous features of the present invention include improved drive currents for NMOS devices, and reduced threshold voltages and reduced leakage currents for PMOS devices.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A method for forming a complementary metal-oxide-semiconductor (CMOS) structure is provided. The intermediate stages of manufacturing embodiments of the present invention are illustrated. Throughout various views and illustrative embodiments of the present invention, like reference numbers are used to designate like elements.

Figure 1:
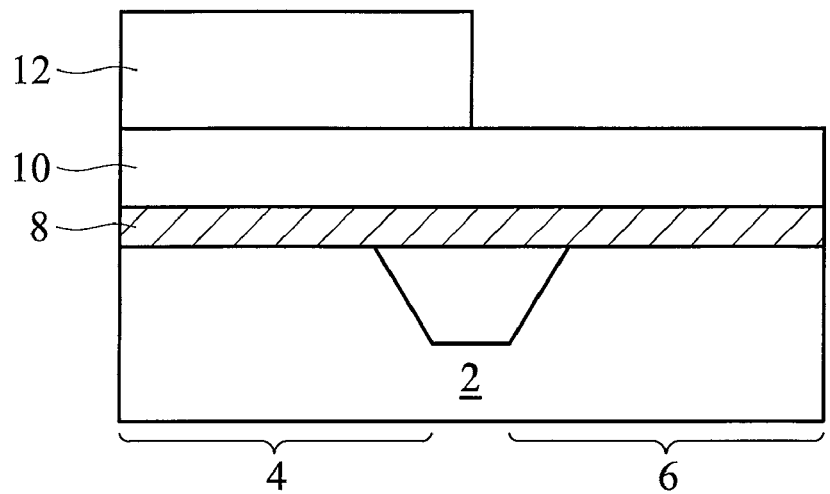
FIGS. 1 through 5 illustrate cross-sectional views of intermediate stages in the formation of a conventional complementary metal-oxide-semiconductor (CMOS) structure, wherein the channel region of a PMOS device is formed of silicon germanium.
Figure 2:
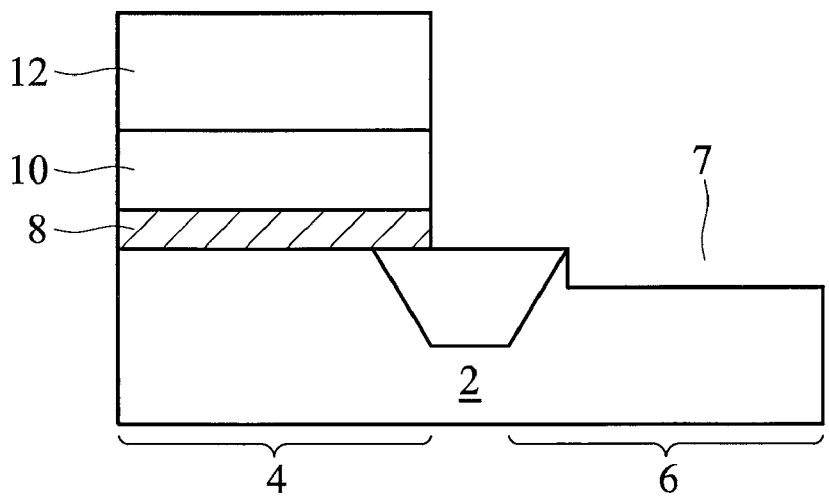
Figure 3:
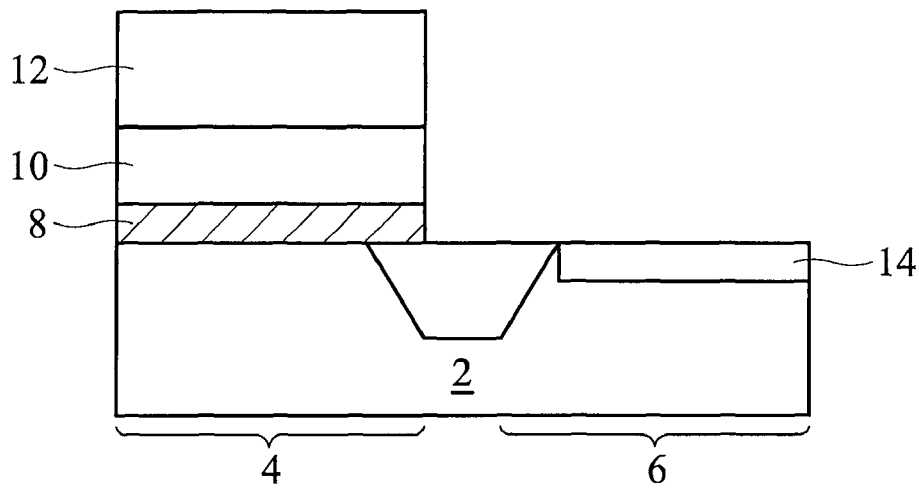
Figure 4:
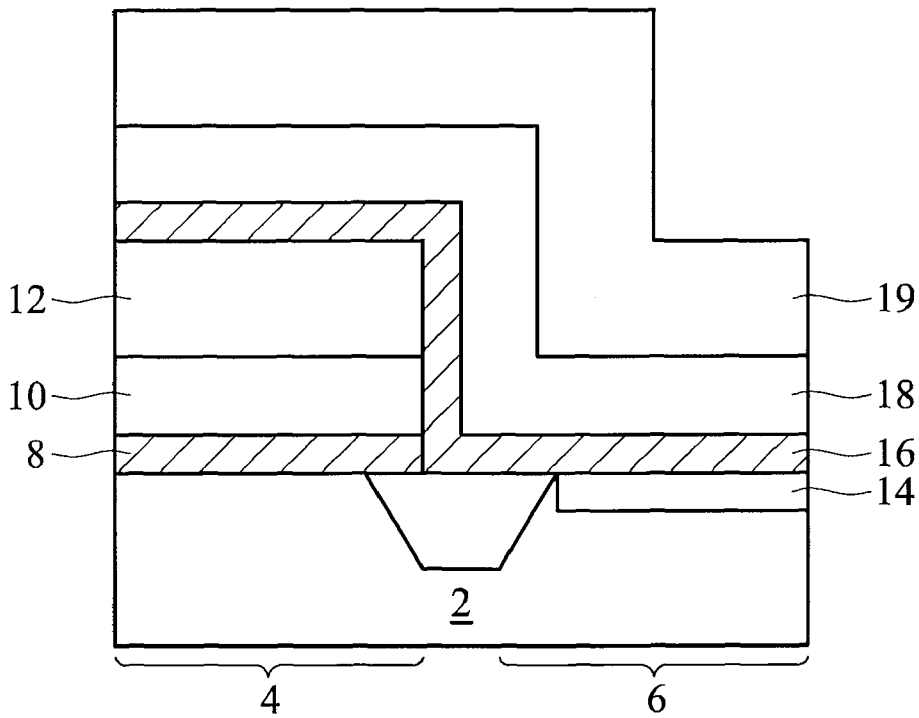
Figure 5:
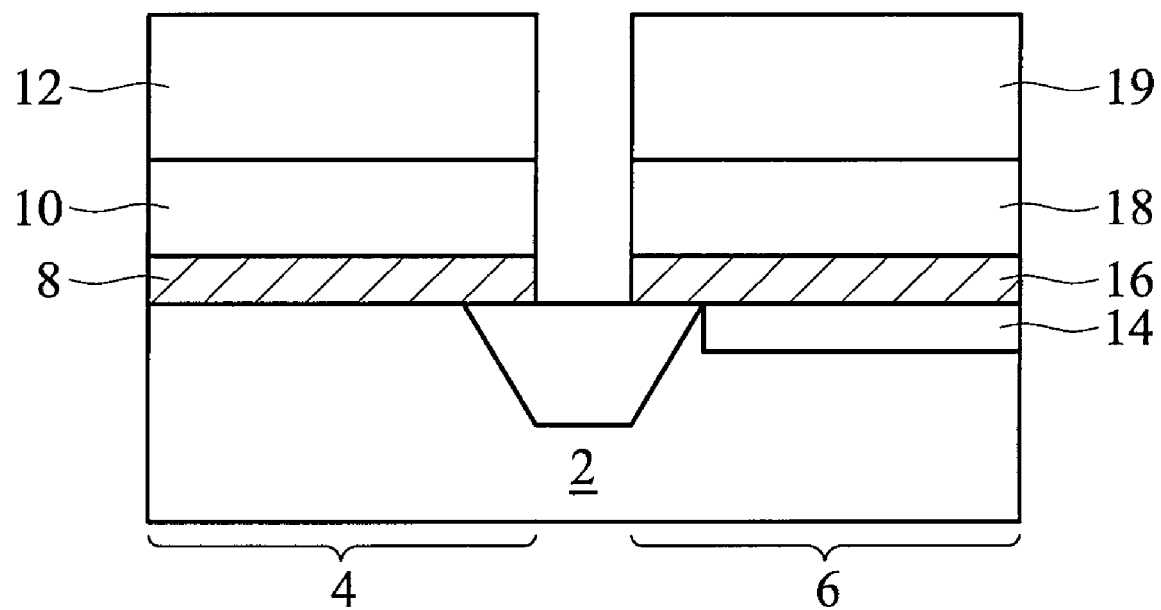
Figure 6:
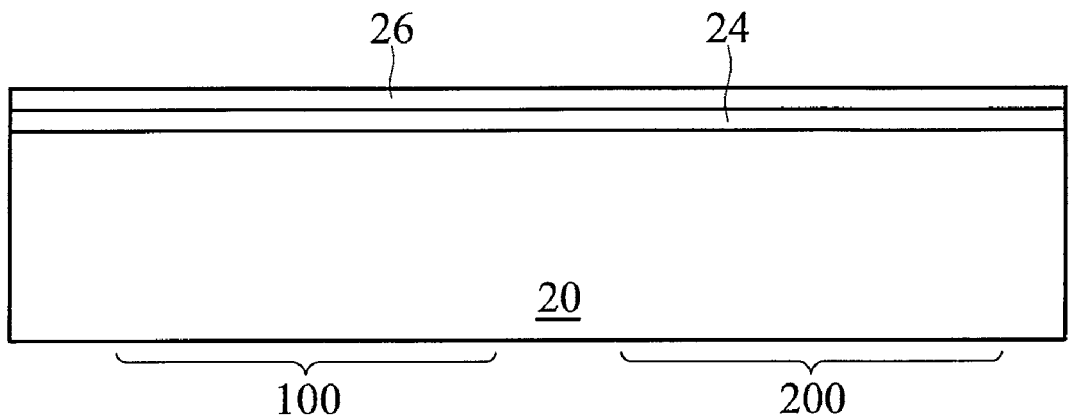
FIGS. 6 through 14 are cross-sectional views of intermediate stages in the manufacturing of embodiments of the present invention.

Referring to FIG. 6, semiconductor substrate 20 is provided, which may be formed of commonly used semiconductor materials and structures such as bulk silicon, silicon-on-insulator (SOI), and the like. Semiconductor substrate 20 includes NMOS region 100 and PMOS region 200. Silicon germanium (SiGe) layer 24 is epitaxial grown on semiconductor substrate 20. In an exemplary embodiment, SiGe layer 24 is formed using reduced pressure chemical vapor deposition in a chamber. The precursors may include Si-containing gases and Ge-containing gases, such as $SiH_4$ and $GeH_4$, respectively. SiGe layer 24 may have a germanium atomic percentage of between about 5 percent and about 30 percent, although different percentages may also be used. The thickness of SiGe layer 24 may be greater than about 50 Å. One skilled in the art will realize, however, that the thickness and other dimensions recited throughout the description are merely examples, and may be changed with the scales of integrated circuits.

Next, silicon layer 26 is epitaxially grown on SiGe layer 24. In the preferred embodiment, silicon layer 26 is formed of pure or substantially pure silicon. In alternative embodiments, silicon layer 26 may also include germanium. However, the germanium atomic percentage in silicon layer 26 is significantly less than in SiGe layer 24. Greater germanium atomic percentage in SiGe layer 24 causes a tensile stress to be generated in silicon layer 26. An exemplary thickness of silicon layer 26 is between about 50 Å and about 400 Å.

Figure 7:
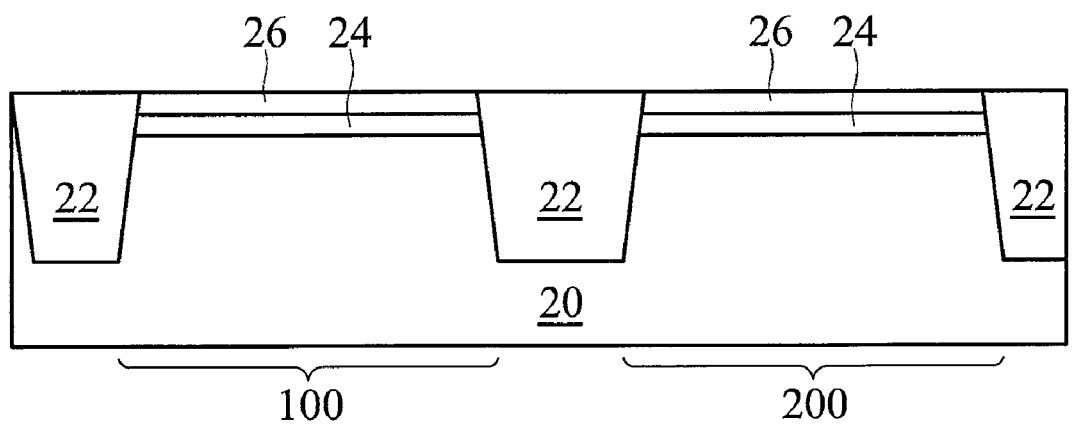

Referring to FIG. 7, shallow trench isolation (STI) regions 22 are formed, and may be used to define the boundaries of NMOS region 100 and PMOS region 200. In alternative embodiments, the formation of STI regions 22 may be performed before the formation of silicon layer 26, or even before the formation of SiGe layer 24.

Figure 8:
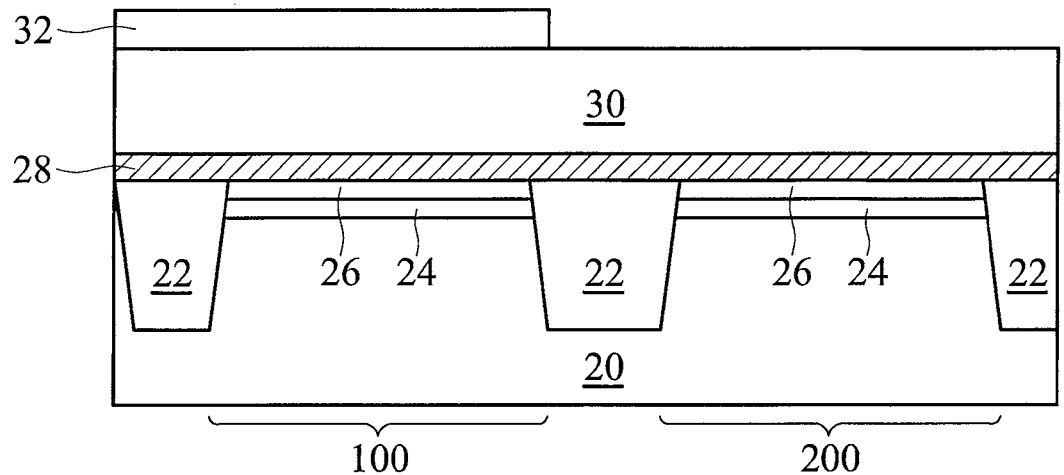

FIG. 8 illustrates the formation of gate dielectric layer 28, metal-containing layer 30, and mask layer 32. In the preferred embodiment, gate dielectric layer 28 is formed of a material having a high dielectric constant (high-k value), for example, greater than about 3.9. The exemplary high-k materials include metal oxides such as $HfO_2$, $ZrO_2$, HfSiON, metal alloy oxides such as HfZrO, HfTaO, HfTiO, and combinations thereof. More preferably, dielectric layer 24 is formed of a lanthanum (La) containing material, such as HfLaO. Advantageously, the La-containing high-k dielectrics are beneficial for reducing the gate work function of the resulting NMOS device. In alternative embodiments, gate dielectric layer 28 may be formed of silicon oxide. In an exemplary embodiment, a thickness of gate dielectric layer 28 is between about 1 nm and about 10 nm. Optionally, a thin interfacial oxide, for example, with a thickness of less than about 1 nm, may be formed underneath dielectric layer 28 to improve the carrier mobility.

Metal-containing layer 30 preferably has a work function suitable for forming NMOS devices, which work function is preferably between about 4.0 eV and about 4.4 eV, and more preferably is a conduction band-edge work function (close to the conduction band of silicon, which is about 4.1 eV). The exemplary materials include tantalum-containing materials such as TaC, TaN, TaSiN, and combinations thereof. Metal-containing layer 30 may have a thickness of between about 8 nm and 100 nm. The formation methods of gate dielectric layer 28 and metal-containing layer 30 include low-pressure chemical vapor deposition (LPCVD), plasma enhanced chemical vapor deposition (PECVD), atomic layer deposition (ALD), physical vapor deposition (PVD), metal-organic chemical vapor deposition (MOCVD), and the like. Hard mask 32 may be formed of silicon nitride, silicon oxynitride, and the like. Hard mask 32 is patterned, and its portion over PMOS region 200 is removed.

Figure 9:
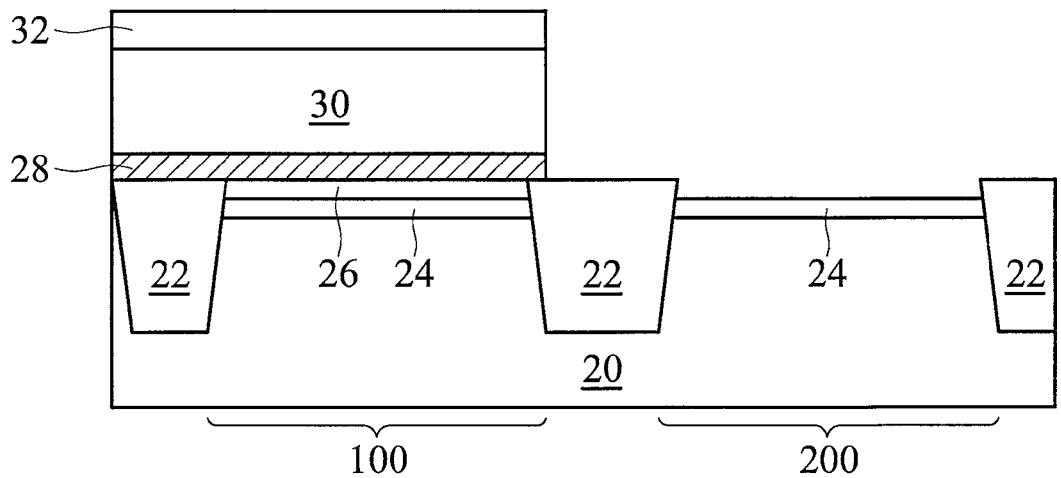

FIG. 9 illustrates the removal of metal-containing layer 30, gate dielectric layer 28, and silicon layer 26 from PMOS region 200, for example, by a dry etch. Hard mask layer 32 protects metal-containing layer 30, gate dielectric layer 28, and silicon layer 26 in NMOS region 100 from being etched.

Figure 10:
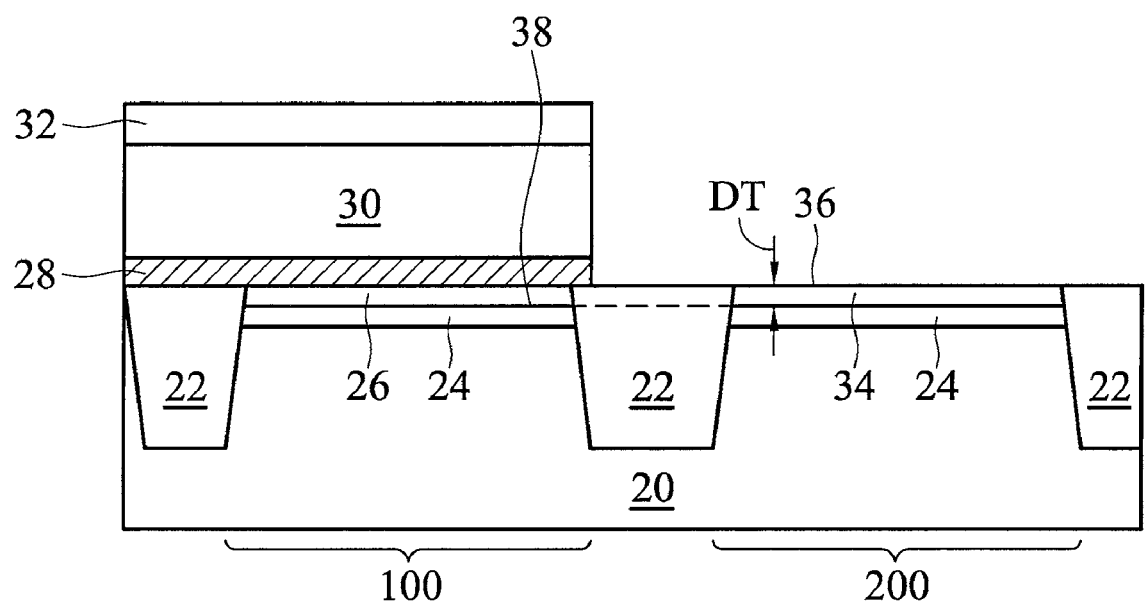

The etching of silicon layer 26 may cause the surface of the underlying SiGe layer 24 to be damaged, and hence the surface of SiGe layer 24 may become rough. This adversely reduces the hole mobility in the resulting PMOS device, whose channel region may reside in SiGe layer 24. A second SiGe layer 34 may thus be epitaxially grown on SiGe layer 24, for example, by using selective epitaxial growth (SEG). The resulting structure is shown in FIG. 10. In an embodiment, SiGe layer 34 has a substantially same atomic percentage as SiGe layer 24. In other embodiments, SiGe layer 34 has a germanium atomic percentage of between about 5 percent and about 30 percent. Preferably, SiGe layer 34 has a greater Ge percentage than that of SiGe layer 24 so that the stress in SiGe layer 34 may be compressive, further enhancing the hole mobility. In alternative embodiments, the Ge percentage in SiGe layer 34 may be less than, or equal to, that of SiGe layer 24. In an exemplary embodiment,. SiGe layer 34 has a thickness of between about 5 Å and about 400 Å. As a result of the possible over-etching of SiGe layer 24 and the formation of SiGe layer 34, the top surface 36 of SiGe layer 34 may be higher than, level with, or lower than, the top surface 38 of the portion of SiGe layer 24 in NMOS region 200. The vertical difference DT may be as high as about 300 Å, and the difference DT may have a positive value (indicating top surface 36 as being higher than top surface 38) or a negative value (indicating top surface 36 as being lower than top surface 38). Please note that silicon gemanium layers 24 and 34 may be distinguishable if they have different germanium atomic percentages. In the case they have a same atomic percentage, however, they may not be distinguishable.

Figure 11:
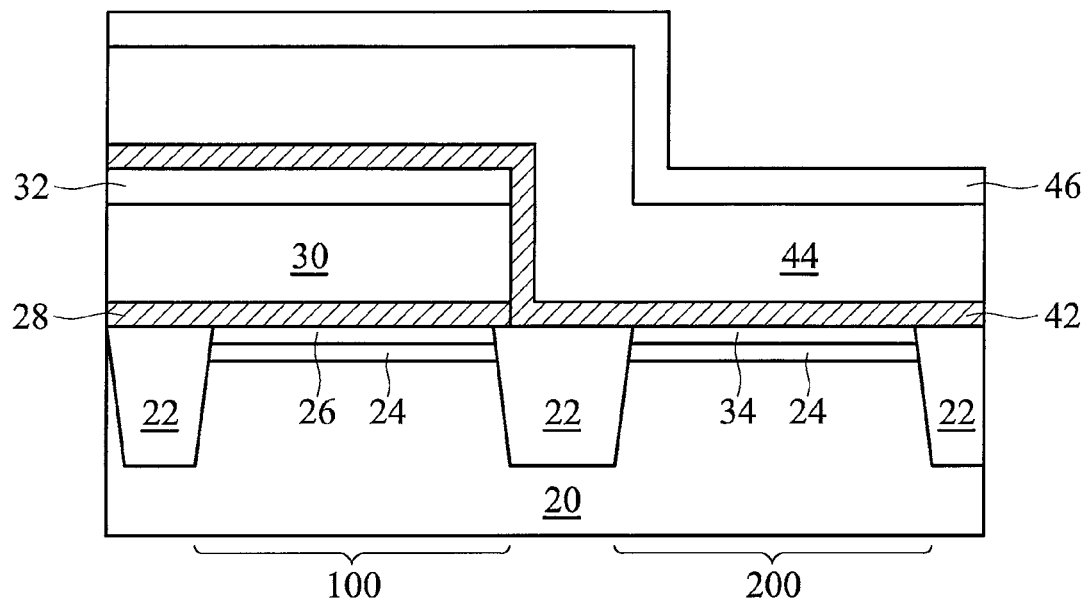

FIG. 11 illustrates the formation of gate dielectric layer 42, metal-containing layer 44, and hard mask 46. Preferably, gate dielectric layer 42 is formed of a high-k dielectric material. The exemplary high-k materials include aluminum-containing dielectrics such as HfAlO, HfAlON, AlZrO, and the like. Other high-k dielectric materials such as Hf-containing materials may also be used. Advantageously, the Al-containing high-k dielectrics are beneficial for reducing the threshold voltage of the resulting PMOS device. In addition, the aluminum in gate dielectric layer 42 may reduce the diffusion of germanium in the underlying silicon germanium layers 24 and 34 into gate dielectric layer 42. As a result, the leakage current of the resulting PMOS device is reduced. In alternative embodiments, gate dielectric layer 42 is formed of silicon oxide. Gate dielectric layer 42 may have an exemplary thickness of be between about 1 nm and about 10 nm. Again, a thin interfacial oxide, for example, with a thickness of less than about 1 nm, may be formed underneath dielectric layer 42 to improve the carrier mobility.

Metal-containing layer 44 preferably has a work function suitable for forming PMOS devices. The preferred work function of metal-containing layer 44 is between about 4.9 eV and about 5.2 eV, and more preferably close to the band-edge work function of about 5.2 eV. The exemplary materials include tungsten-containing materials such as tungsten and tungsten nitride, ruthenium-containing materials such as ruthenium and ruthenium oxide, molybdenum-containing materials such as molybdenum and molybdenum nitride, or combinations thereof. Gate dielectric layer 42 and metal-containing layer 44 may be formed using essentially the same methods for forming gate dielectric layer 28 and metal-containing layer 30, respectively. Hard mask layer 44, which may be formed of essentially the same material as hard mask 32, is then formed.

Figure 12:
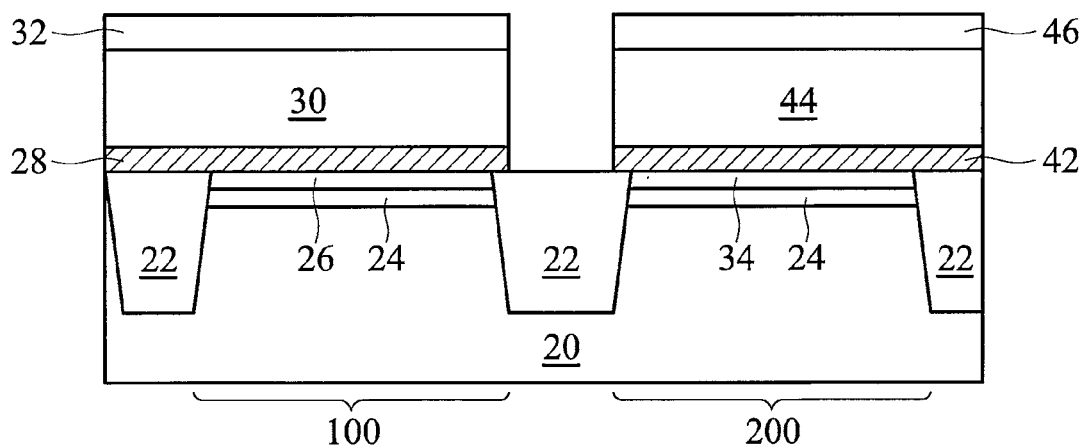
Figure 13:
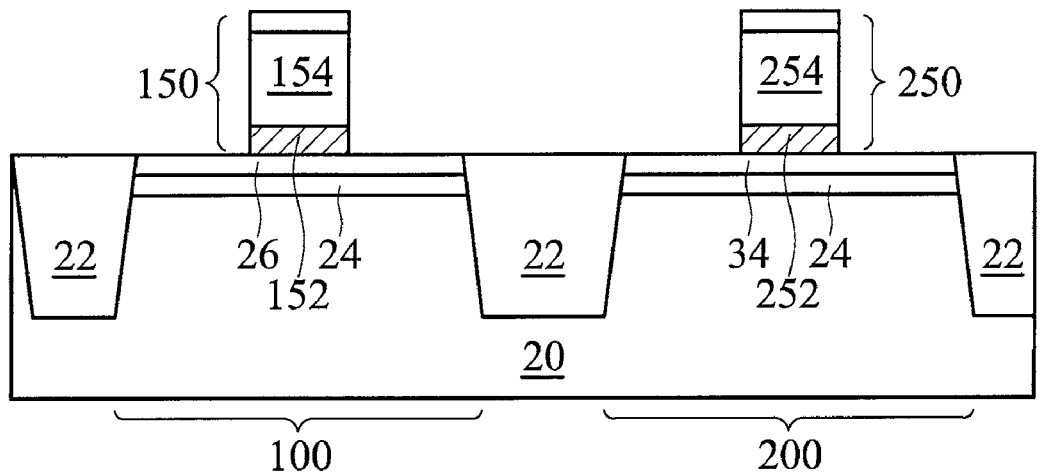

Referring to FIG. 12, gate dielectric layer 42, metal-containing layer 44 and hard mask layer 46 are patterned, and are removed from NMOS region 100. A further gate patterning is then performed to form gate stacks 150 and 250, forming the structure as shown in FIG. 13. As a result, gate dielectric 152 and gate electrode 154 are formed in NMOS region 100, and gate dielectric 252 and gate electrode 254 are formed in PMOS region 200. In alternative embodiments, gate stack 250 may be formed directly from the structure shown in FIG. 11, without going through the step shown in FIG. 12.

Figure 14:
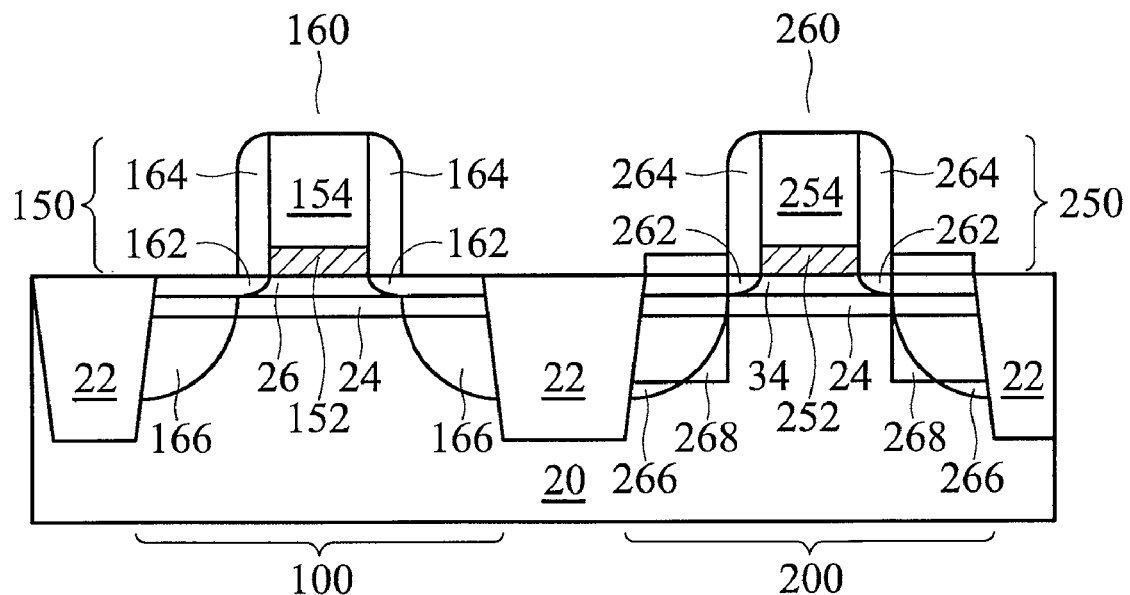

FIG. 14 illustrates the formation of the remaining components of NMOS device 160 and PMOS device 260. First, lightly doped source/drain (LDD) regions 162 and 262 are formed. As is known in the art, LDD regions 162 and 262 may be formed by implanting n-type and p-type impurities into NMOS region 100 and PMOS region 200, respectively. Due to the masking of gate stacks 150 and 250, LDD regions 162 and 262 are substantially aligned to the edges of gate stacks 150 and 250, respectively.

Gate spacers 164 and 264 are formed on sidewalls of gate stacks 150 and 250, respectively. Preferably, gate spacers 164 and 264 are formed by depositing one or more spacer layer(s) (not shown), and removing horizontal portions of the spacer layer(s) by etching. In the preferred embodiment, the spacer layers include a nitride layer on a liner oxide layer. The preferred spacer deposition methods include PECVD, LPCVD, sub-atmospheric CVD (SACVD), and the like.

FIG. 14 also illustrates the formation of deep source/drain regions 166 and 266 and SiGe stressors 268. The formation processes for deep source/drain regions 166 and 266 and SiGe stressors 268 are well known in the art, and thus are not repeated herein. Source/drain silicide regions (not shown) are then formed.

The embodiments of the present invention have several advantageous features. Since NMOS device 160 is formed on silicon, which is further formed on SiGe, the electron mobility in the channel region is improved due to the strain caused by the lattice mismatch between silicon and SiGe. On the other hand, PMOS device 260 is formed on silicon germanium, so that the threshold voltage of PMOS device 260 is reduced. Further, doping aluminum into the gate dielectric of PMOS device 260 results in the reduction in the diffusion of germanium into the overlying gate dielectric, and hence the leakage current in PMOS device 260 is reduced.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for forming a semiconductor structure, the method comprising:
    providing a silicon substrate comprising an NMOS region and a PMOS region;
    epitaxially growing a first silicon germanium layer over the silicon substrate, wherein the first silicon germanium layer comprises a first portion over the NMOS region, and a second portion over the PMOS region;
    epitaxially growing a silicon-containing semiconductor layer over the first silicon germanium layer, wherein a germanium percentage in the silicon-containing semiconductor is lower than a germanium percentage in the first silicon germanium layer;
    forming a first gate dielectric layer over the silicon-containing semiconductor layer;
    forming a first gate electrode layer over the first gate dielectric layer;
    removing the first gate electrode layer, the first gate dielectric layer, and the silicon-containing semiconductor layer from over the PMOS region;
    forming a second gate dielectric layer, wherein the second gate dielectric layer comprises at least a portion over the second portion of the first silicon germanium layer;
    forming a second gate electrode layer over the second gate dielectric layer;
    patterning the first gate dielectric layer and the first gate electrode layer to form a first gate stack; and
    patterning the second gate dielectric layer and the second gate electrode layer to form a second gate stack.

2. The method of claim 1, wherein the steps of forming the second gate electrode layer and the second gate dielectric layer comprises:
    blanket forming the second gate dielectric layer;
    blanket forming the second gate electrode layer; and
    removing the second gate electrode layer and the second gate dielectric layer from over the NMOS region.

3. The method of claim 1, wherein the first gate dielectric layer comprises lanthanum and is free from aluminum, and the second gate dielectric layer comprises aluminum and is free from lanthanum.

4. The method of claim 1 further comprising, after the step of removing the first gate electrode layer, the first gate dielectric layer, and the silicon-containing semiconductor layer from over the PMOS region, epitaxially growing a second silicon germanium layer over and contacting the first silicon germanium layer.

5. The method of claim 1, wherein the silicon-containing semiconductor layer is a substantially pure silicon layer.

6. The method of claim 1, wherein the silicon-containing semiconductor layer is a silicon germanium layer.

7. The method of claim 1, wherein before the step of patterning the second gate dielectric layer and the second gate electrode layer, the second gate dielectric layer and the second gate electrode layer extend to directly over remaining portions of the first gate dielectric layer and the first gate electrode layer.

8. The method of claim 1, wherein after the step of removing the silicon-containing semiconductor layer from over the PMOS region, at least a layer of the silicon-containing semiconductor layer is removed from directly over the NMOS region.

9. A method for forming a semiconductor structure, the method comprising:
   providing a silicon substrate comprising an NMOS region and a PMOS region;
   epitaxially growing a first silicon germanium layer over the silicon substrate, wherein the first silicon germanium layer comprises a first portion over the NMOS region, and a second portion over the PMOS region;
   epitaxially growing a substantially pure silicon layer over the first silicon germanium layer;
   forming a first gate dielectric layer over the substantially pure silicon layer;
   forming a first gate electrode layer over the first gate dielectric layer;
   removing the first gate electrode layer, the first gate dielectric layer, and the substantially pure silicon layer from over the PMOS region, wherein the substantially pure silicon layer is not removed from over the NMOS region;
   after the step of removing, epitaxially growing a second silicon germanium layer over and contacting the first silicon germanium layer;
   forming a second gate dielectric layer, wherein the second gate dielectric layer comprises at least a portion directly over the second portion of the first silicon germanium layer;
   forming a second gate electrode layer over the second gate dielectric layer;
   patterning the first gate dielectric layer and the first gate electrode layer to form a first gate stack; and
   patterning the second gate dielectric layer and the second gate electrode layer to form a second gate stack.

10. The method of claim 9, wherein the steps of forming the second gate electrode layer and the second gate dielectric layer comprises:
   blanket forming the second gate dielectric layer; and
   blanket forming the second gate electrode layer.

11. The method of claim 9, wherein the first gate dielectric layer comprises lanthanum and is free from aluminum, and the second gate dielectric layer comprises aluminum and is free from lanthanum.

* * * * *